United States Patent [19]  [11] Patent Number: 4,819,081
Volk et al.  [45] Date of Patent: Apr. 4, 1989

[54] PHASE COMPARATOR FOR EXTENDING CAPTURE RANGE

[75] Inventors: Andrew M. Volk, Loomis; Terry L. Baucom, Citrus Heights; Roger Van Brunt, San Francisco, all of Calif.

[73] Assignee: Intel Corporation, Santa Clara, Calif.

[21] Appl. No.: 92,477

[22] Filed: Sep. 3, 1987

[51] Int. Cl.$^4$ ............................................. H03D 3/02
[52] U.S. Cl. ................................... 328/134; 328/133; 328/155; 331/1 A; 375/119
[58] Field of Search ............... 328/155, 133, 134, 63, 328/72; 307/514, 516, 119, 120; 331/25, 10, 11, 1 A, DIG. 2; 375/119, 120

[56] References Cited

U.S. PATENT DOCUMENTS

| | | | |
|---|---|---|---|
| 3,528,026 | 9/1970 | Groendycke | 331/11 |
| 3,579,281 | 5/1971 | Kam et al. | 331/10 |
| 3,676,794 | 7/1972 | Bidell et al. | 331/11 |
| 4,151,485 | 4/1979 | LaFratta | 331/11 X |
| 4,434,407 | 2/1984 | Healey, III et al. | 331/10 X |
| 4,516,250 | 5/1985 | Grimes | 328/134 X |
| 4,528,523 | 7/1985 | Crowley | 331/10 |
| 4,694,259 | 9/1987 | Carickhoff et al. | 331/10 X |
| 4,733,197 | 3/1988 | Chow | 331/1 A |

Primary Examiner—Eugene R. Laroche
Assistant Examiner—Seung Ham
Attorney, Agent, or Firm—Blakely, Sokoloff, Taylor & Zafman

[57] ABSTRACT

An extended range logic circuit is activated to decrease the settling time and prevent slip, when phase difference of two signals being compared by a phase comparator reaches a slip point. The circuit provides error correction signals to compensate for the phase correction at a much faster rate when the phase error reaches a predetermined point, which is proximate to the slip point. However, the extended capture range circuit in only active during the lock acquisition. After lock is achieved the extended capture range logic is disabled, to provide better jitter performance.

4 Claims, 7 Drawing Sheets

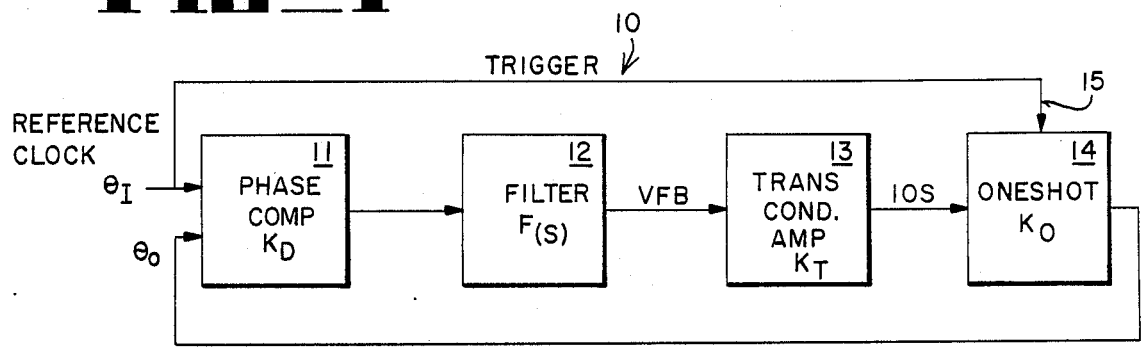
FIG_1
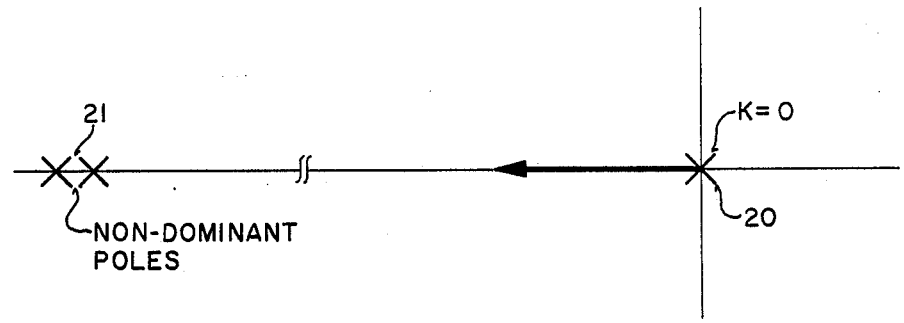
FIG_2
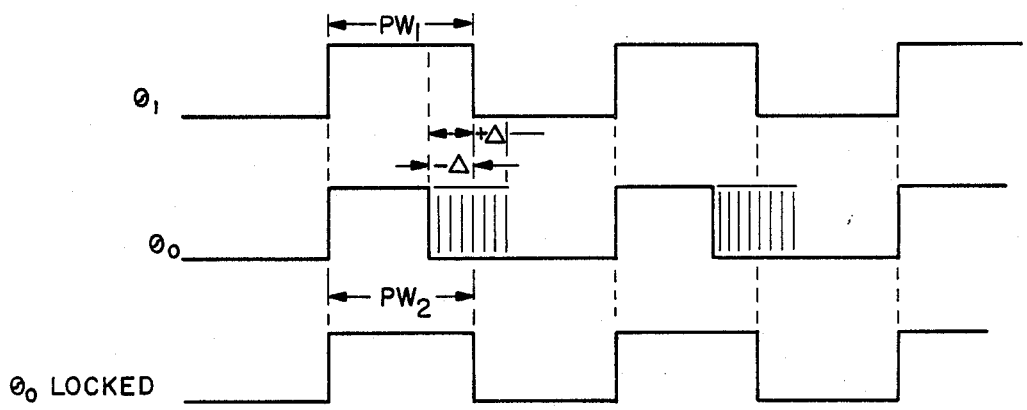
FIG_3

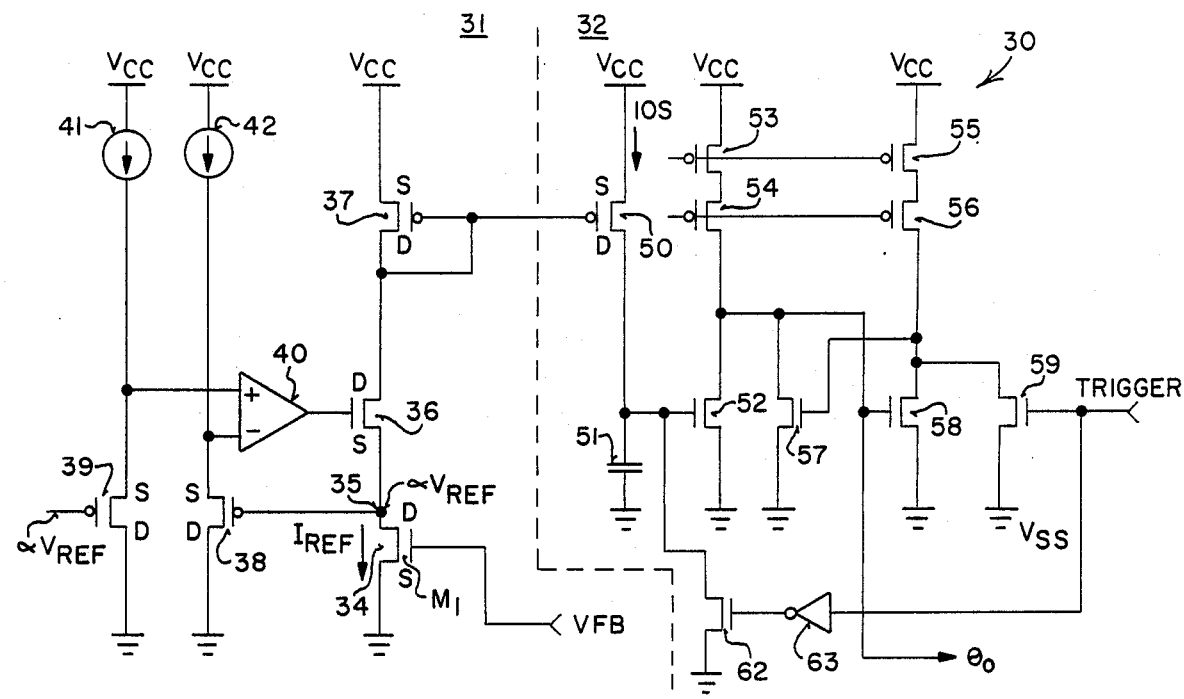
FIG_4
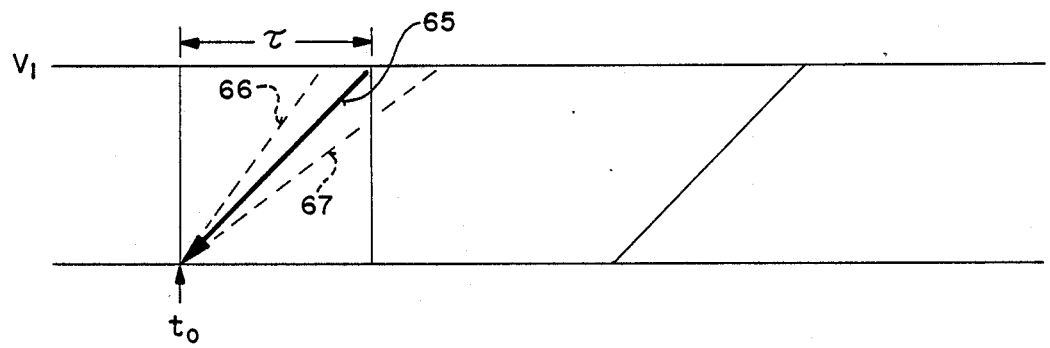
FIG_5

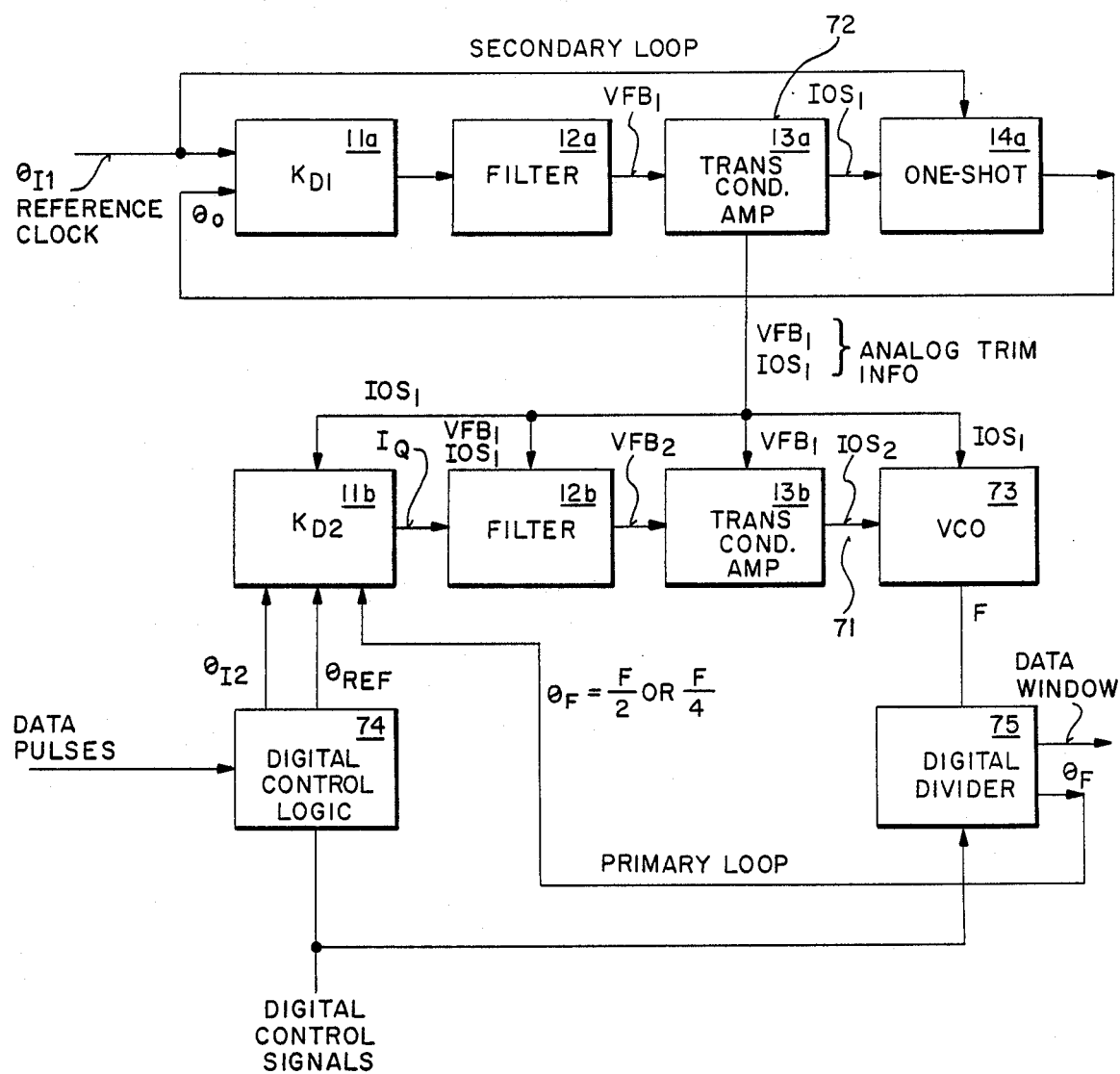
FIG_6
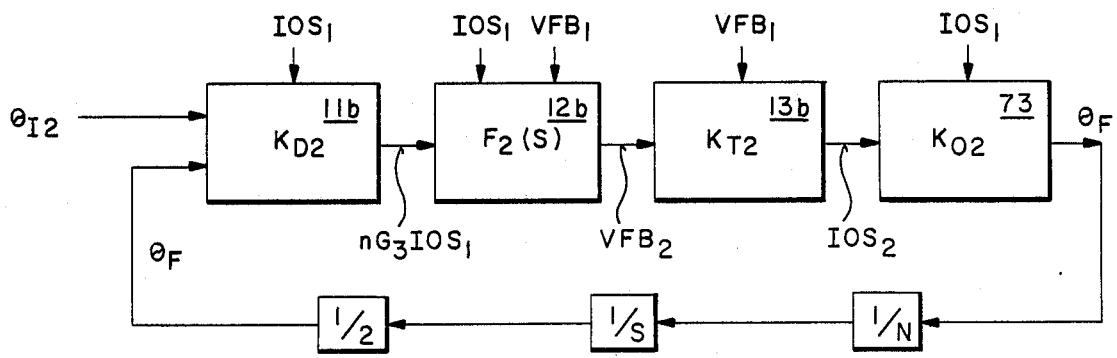
FIG_7

FIG_8
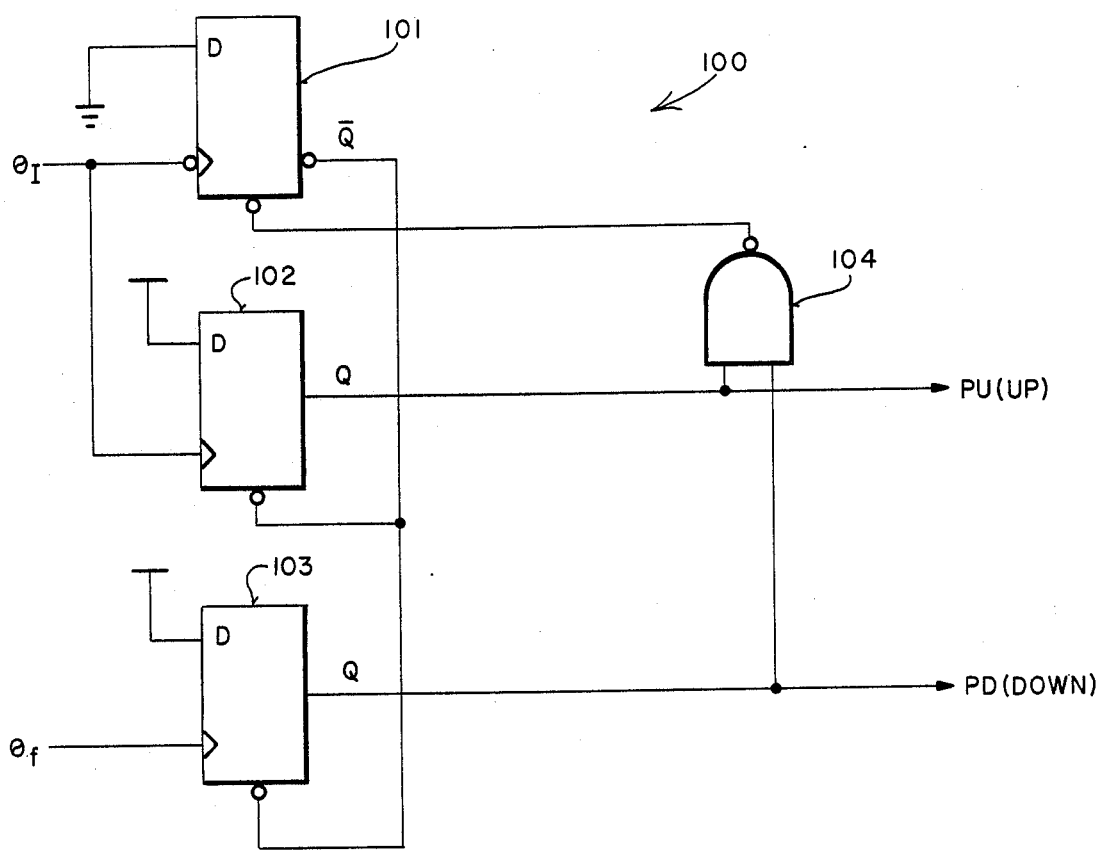
FIG_9
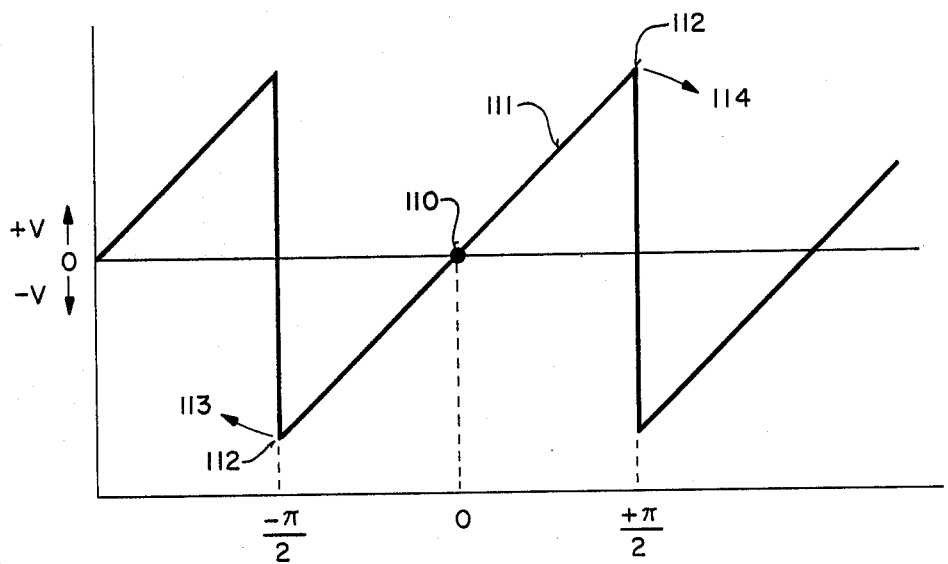

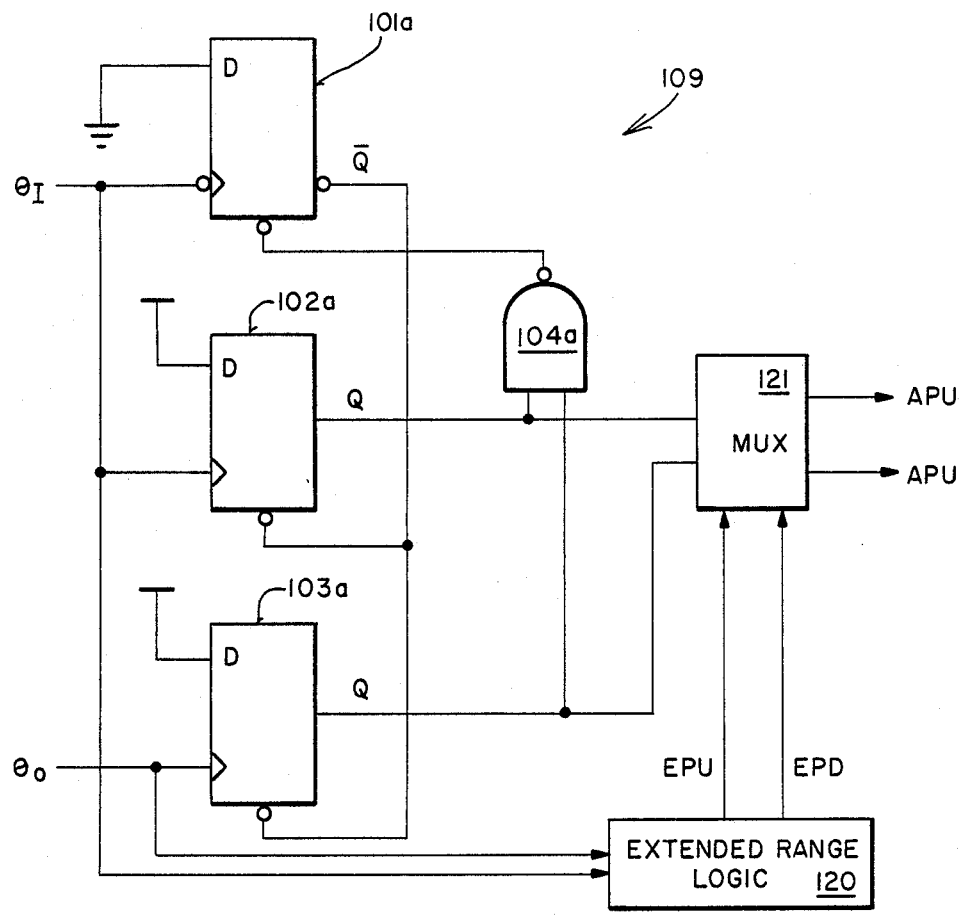
FIG_10
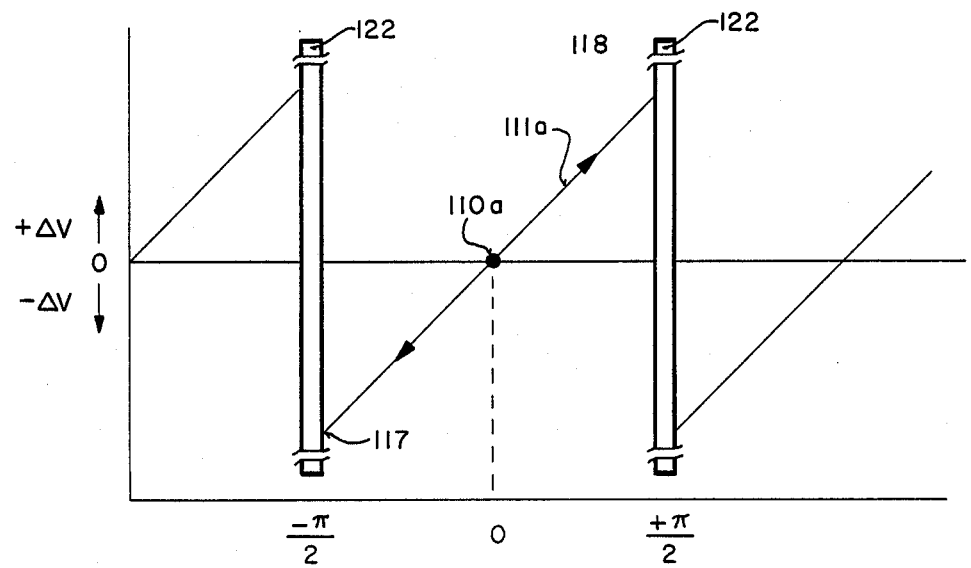
FIG_11

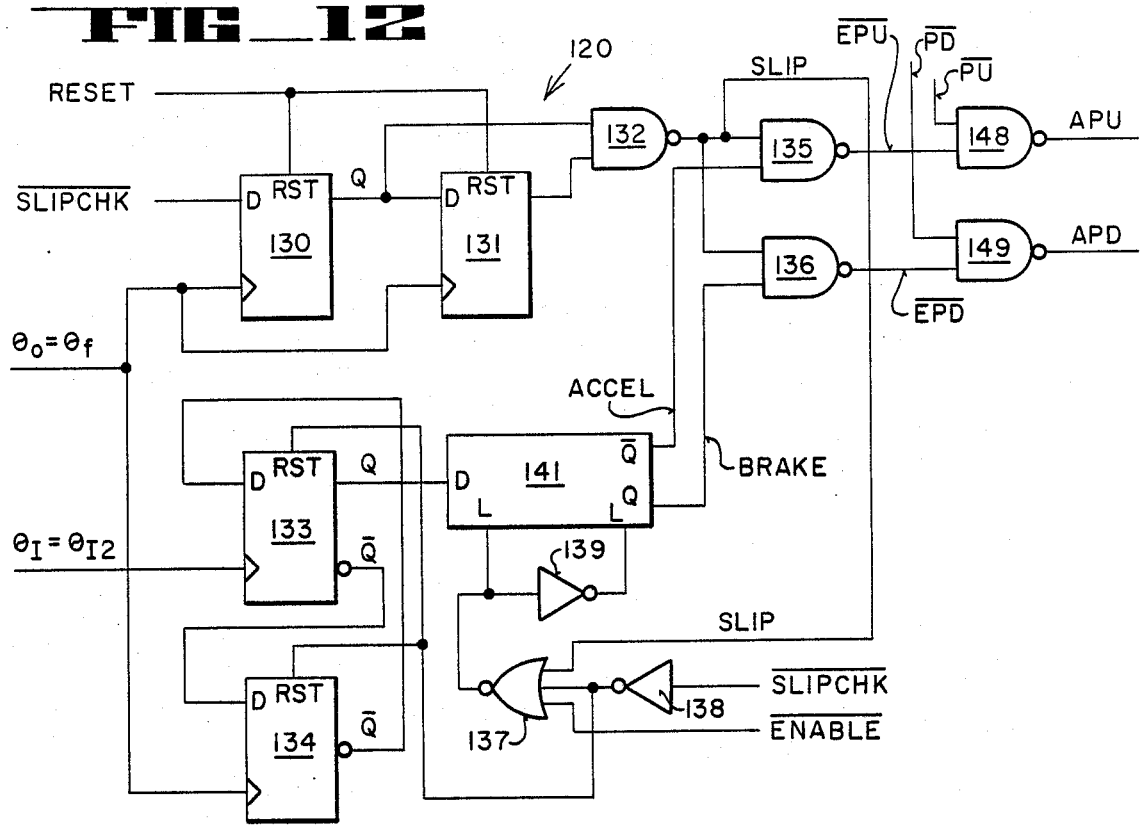
FIG_12
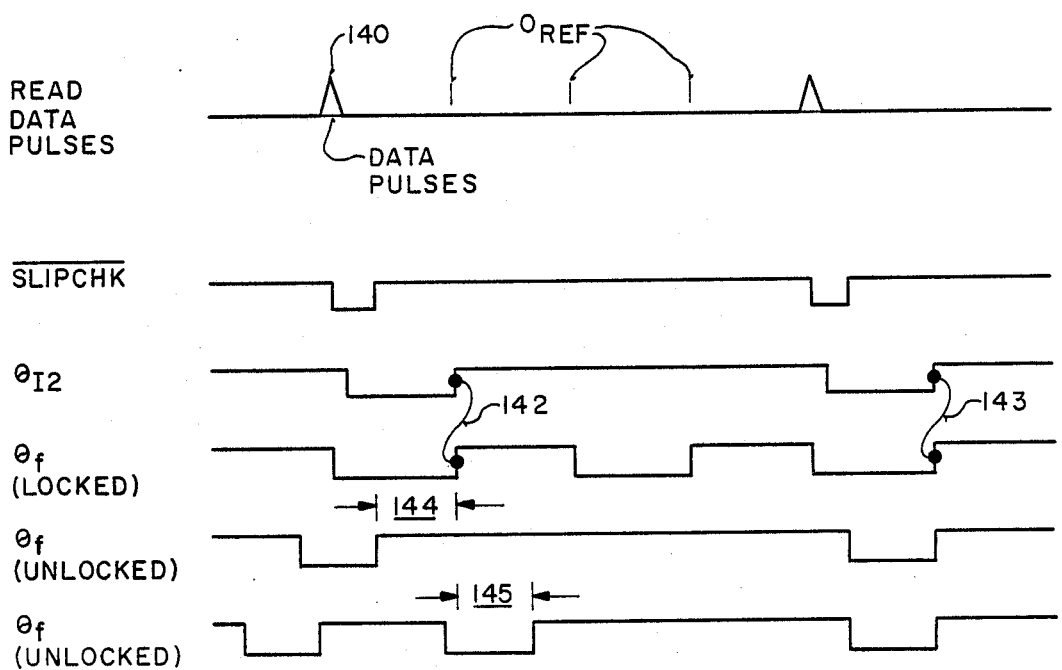
FIG_13

FIG_14
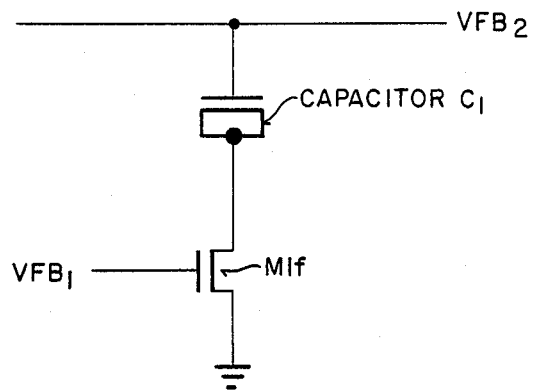
FIG_15
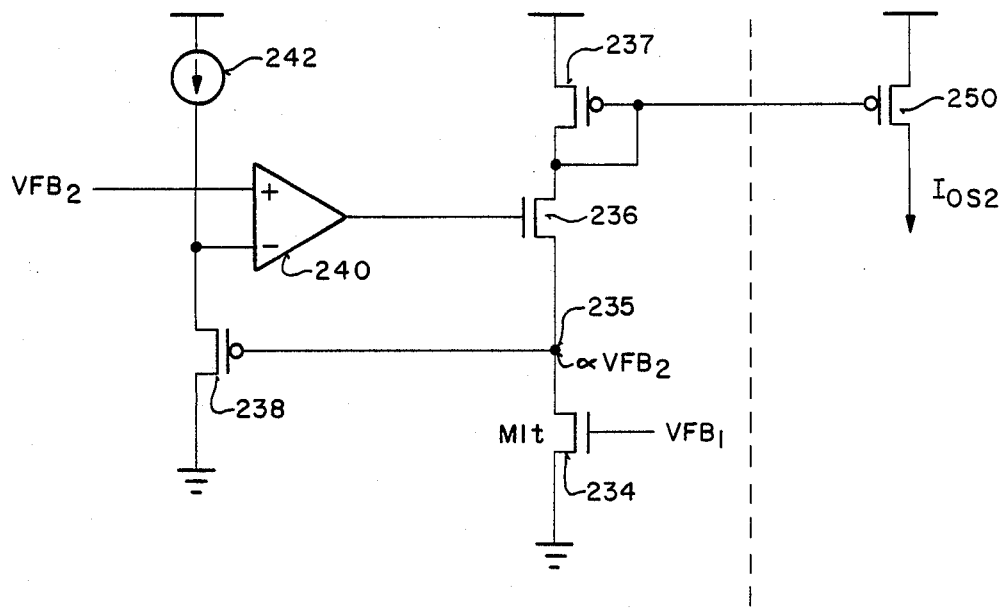

PHASE COMPARATOR FOR EXTENDING CAPTURE RANGE

BACKGROUND OF THE INVENTION

1. Field of the Invention

The present invention relates to the field of error compensating loops and more specifically to stabilized integrated phase locked loop systems.

2. Related Application

The present application is related to copending application Ser. No. 92,478, filed Sept. 3, 1987, entitled "Stabilized Phase Locked Loop".

3. Prior Art

Phase locked loop systems are well known in the prior art wherein these loops are utilized to maintain stable frequency, phase and other circuit parameters. Phase locked loops must have stable and controlled operating characteristics, immune to voltage, temperature and circuit fabrication variations. This is especially so during the operation of the phase locked loop when environmental conditions can change readily. Primary parameters which are essential for the operation of a stable phase locked loop are loop gain and filter characteristics.

Typically, dynamic loop characteristics of integrated phase locked loops require off-chip adjustment to control the loop parameters. This is achieved by adjusting the loop filter, or changing the loop gain and are typically made with respect to an external standard reference. Further, there are two specifications imposed on most phase locked loop systems which by nature are diametrically opposite to each other. These two specifications are settling time and jitter response.

For a phase locked loop to have a satisfactory settling time the loop should respond fast to external data changes but the response must not be too fast in order to have a good jitter specification. A trade off must be made between these two specifications and often it is difficult to satisfy both requirements simultaneously. In prior art, a common solution is to create a two or multiple gain loop system in which a two gain loop is utilized. A fast mode is used to satisfy the required settling time specification and after the loop has achieved lock, the high gain mode is switched off. When the high gain mode is off, the jitter specifications are satisfied because of the low gain.

It is appreciated then that what is required is a phase locked loop system which is capable of being independent of various circuit process and environmental conditions without the use of external compensation and which also is capable of having a satisfactory settling time with a good immunity to read data jitter.

SUMMARY OF THE INVENTION

The present invention provides for a phase locked loop system using a standard RC time constant to control the loop characteristics and the use of an extended range logic circuit to provide dual compensation rates for the phase locked loop. The phase locked loop system of the present invention utilizes two loops, a primary loop and a secondary loop. The secondary loop is comprised of an analog based one-shot, instead of a VCO. A reference signal and the output of the one shot are compared in a phase comparator and the phase difference is provided to a filter which generates an error voltage to a transconductance amplifier. Upon receiving the error voltage, the transconductance amplifier will vary the conduction of a metering transistor to vary the current through the transistor. The current is provided as an input current to the one-shot wherein a capacitor is charged to a predetermined value which determines the duration of the one-shot. Because of the combination of the resistance of the metering transistor and the capacitance of the input capacitor, the RC combination determines the pulse width duration of the output of the one-shot. The error voltage and the input current values which provide the compensation for the secondary loop are also transmitted to the primary loop as analog trim signals.

The primary loop is also comprised of a phase comparator, a filter, a transconductance amplifier and an output means. However, in this instance the secondary loop also uses the analog trim information to compensate for various parameter variations. The output means of the secondary loop is a VCO and a frequency divider is also used in the preferred embodiment. The dual loop system allows, if properly exploited, creates a system which is to the first order immune to process and operating environment variation. The level of stability is provided by establishing the damping factor, settling time and the center frequency with respect to a constant reference frequency. The system creates a standard RC element and bases all loop currents on the reference frequency, thus the accuracy will depend primarily on the external reference data. Furthermore the loop can be programmed to different data rates by adjusting the reference clock frequency.

Further, a special phase comparator is used in the primary loop to provide for an extended range logic circuit which is activated when a phase slip condition is about to occur. When the phase error is limited to a small value near the center zero phase point, a slower settling time is used to prevent jitter. However, as the phase difference approaches the slip point, the extended range circuit is activated to provide a more rapid settling time to compensate for the additional phase error to prevent slip from occurring.

BRIEF DESCRIPTION OF THE DRAWINGS

FIG. 1 is a block diagram illustrating a phase locked loop utilizing a one-shot to provide a feedback signal as used in the present invention, as the secondary PLL.

FIG. 2 is a graphic illustration showing the various poles of the phase locked loop circuit of FIG. 1.

FIG. 3 is a waveform diagram showing a reference signal, unlocked feedback signal, and a locked feedback signal from the one-shot for the phase locked loop of FIG. 1.

FIG. 4 is a schematic diagram showing a transconductance amplifier and a one-shot of the present invention.

FIG. 5 is a graphic illustration showing the determination of a timing duration of the one-shot of FIG. 4.

FIG. 6 is a block diagram illustration showing a dual phase locked loop architecture of the present invention.

FIG. 7 is a transfer function block diagram illustration showing an equivalent circuit of a primary loop of FIG. 6.

FIG. 8 is a schematic diagram showing a phase comparator as used in the present invention.

FIG. 9 is a graphic illustration showing the phasing operation of the phase comparator of FIG. 8.

FIG. 10 is an enhanced phase comparator of the present invention which utilizes an extended range logic circuit.

FIG. 11 is a graphic illustration showing the phasing operation of the circuit of FIG. 10.

FIG. 12 is a circuit schematic diagram of the extended range logic circuit of FIG. 10 as implemented in the preferred embodiment.

FIG. 13 is a waveform diagram of the various signals used in FIG. 12.

FIG. 14 is a schematic diagram of a loop filter of the primary loop of FIGS. 6 and 7.

FIG. 15 is a schematic diagram of a transconductor amplifier of FIGS. 6 and 7.

DETAILED DESCRIPTION OF THE PRESENT INVENTION

The present invention describes a constant RC product stabilization of a phase locked loop using a one-shot based secondary phase locked loop, and the use of a phase comparator for extending capture range. In the following description, numerous specific details are set forth such as specific circuits, components, timing diagrams, etc., in order to provide a thorough understanding of the present invention. It will be obvious, to one skilled in the art that the present invention may be practiced without these specific details. In other instances, well-known circuits have not been described in detail in order not to unnecessarily obscure the present invention.

One-Shot Based Phase Locked Loop

Referring to FIG. 1, a block diagram of a phase locked loop (PLL) utilizing a monostable multivibrator (one-shot) is shown. The PLL 10 is comprised of a phase comparator 11, filter 12, transconductance amplifier 13 and one-shot 14. A reference clock pulse, $\theta_I$, is coupled as input to phase comparator 11. Reference clock pulse $\theta_I$ is also coupled to one-shot circuit 14 to provide a signal to trigger one-shot 14. Phase comparator 11 also receives as an input the output of one-shot 14 as referenced by $\theta_O$.

Phase comparator 11 compares the reference clock signal $\theta_I$ and the output of the one-shot $\theta_O$ by comparing the pulse widths of the two input signals $\theta_I$ and $\theta_O$. A variety of phase comparator circuits well-known in the prior art can be utilized to provide the pulse width comparison achieved in the phase comparator 11 of the present invention. Although FIG. 1 shows the same $\theta_I$ inputs to phase comparator 11 and one-shot 14, it is appreciated that circuits 11 and 14 need not trigger at the same instance and that a delay can be used at the input. A transfer function of the phase comparator 11 is represented as $K_D$.

The output of the phase comparator 11 is coupled to a filter 12. Filter 12 utilizes a single capacitor $C_r$ to provide a storage element for the phase lock loop of circuit 10 and, therefore, has a single dominant pole as represented by the transfer function $F(s)=1/SCr$. Such use of capacitor filters, especially a loop filter within a PLL circuit, is well-known in the prior art.

The output of filter 12 is a voltage signal designated VFB and is coupled to transconductance amplifier 13 which has a transfer function of $K_T$. Transconductance amplifier 13 transforms VFB signal to a current signal IOS for controlling the turn-on duration of one-shot 14. One-shot 14 is a monostable multivibrator which is in its stable state until triggered by the reference clock signal $\theta_I$. Once triggered, one-shot 14 generates an output $\theta_O$, wherein the duration of the astable pulse of the one-shot is determined by the value of IOS. One-shot 14 is designated to have a transfer function $K_O$.

In operation, PLL 10 is a closed loop system having one reference input $\theta_I$, wherein the output $\theta_O$ of the one-shot provides the closed loop feedback for maintaining the phase lock of PLL 10. When a reference pulse $\theta_I$ is received, one-shot 14 is triggered by $\theta_I$ on line 15. The output $\theta_O$ is compared to the reference signal $\theta_I$ in the phase comparator 11. If the pulse width of the reference signal $\theta_I$ is equal to the pulse width of $\theta_O$, then no adjustment is made because PLL 10 is in the locked condition. However, if the comparison results in a difference of the pulse widths of the two input signals, then an error signal is generated from phase comparator 11 and processed by filter 12, wherein filter 12 generates the error feedback voltage VFB, the magnitude change of VFB being proportional to the amount of the difference of the pulse widths of $\theta_I$ and $\theta_O$. In the locked condition, VFB will have a value corresponding to zero error. When $\theta_O$ pulse width is shorter in duration than $\theta_I$, then VFB will vary in one direction from the error free value; and when $\theta_O$ pulse width is longer in duration than $\theta_I$, then VFB will vary in the opposite direction from the error free value.

VFB is coupled as an input to amplifier 13, wherein amplifier 13 has a transformation value of $K_T$. VFB is amplified by a factor of $K_T$ to provide IOS. The pulse width of one-shot 14 is inversely proportional to the amount of current, IOS, being provided by the transconductance amplifier 13. For example, if $\theta_O$ has a longer pulse width than $\theta_I$, phase comparator 11 and filter 12 will increase the feedback voltage VFB and transconductance amplifier 13 will increase IOS to reduce the pulse width of $\theta_O$ to coincide with $\theta_I$. When $\theta_O$ has a shorter pulse width than $\theta_I$, VFB and IOS are reduced.

Referring to FIG. 2, a root locus diagram of the secondary loop shows an advantage of the single dominant pole filter 12 of the present invention. Filter 12, having a transfer function $F(s)=1/SC_r$, provides for a simple first order closed loop system wherein a single dominant pole 20 is located at the origin. Other poles 21 are located a considerable distance from the origin, such that their effects are negligible and they are treated as non-dominant poles. Prior art phase lock loop systems typically use a voltage-controlled oscillator (VCO), wherein the closed loop system usually has two dominant poles near the origin. Using the single pole design provides a system which is inherently stable. In the VCO loop which has two poles near the origin, stability must be designed into the system.

Referring to FIGS. 1 and 3, the reference clock signal $\theta_I$ is shown having a pulse width $PW_1$. The pulse width of $\theta_O$ will vary, but if the loop is in a locked condition, then the pulse width $PW_2$ of $\theta_{O\text{-}LOCKED}$ will have the same pulse width as $PW_1$. If the pulse width of $\theta_O$ is not equal to $PW_1$, then it will have a difference of $-\Delta$ if it is too short, or $+\Delta$ if it is too long. The comparison of $\theta_I$ to $\theta_O$ by phase comparator 11 will generate error feedback voltage VFB from filter 12, wherein the change of the feedback voltage VFB is proportional to the differences $-\Delta$ or $+\Delta$. The pulse width adjustment is better understood when FIG. 5 is also referenced.

FIG. 5 shows the duration of the pulse width $\theta_O$ as time period $\tau$. Period $\tau$ is equivalent to the charging time of the capacitor of one-shot 14, wherein current IOS charges this capacitor. The capacitor commences to charge at time $t_0$ when one-shot 14 is triggered and stops charging when a predetermined voltage level $V_1$ is reached. $\tau$ is the time period it takes to charge from $t_0$ to voltage $V_1$. If pulse widths of $\theta_O$ and $\theta_I$ are equal, then slope 65 is followed to give the desired lock condition. If $\theta_O$ has an error of $-\Delta$, $\tau$ of $\theta_O$ is represented by slope 66. Phase comparator 11 and filter 12 will compensate by decreasing VFB and thereby decreasing IOS. Because IOS, which is the capacitor charging current, is decreased, $\tau$ shifts from slope 66 to that of slope 65. In reverse, if $\theta_O$ has an error of $+\Delta$, as represented by slope 67, VFB and IOS are increased such that $\tau$ shifts from slope 67 to the desired slope 65.

Referring to FIG. 4, it shows a preferred circuit implementation of the transconductance amplifier 13 and one-shot 14 of FIG. 1. Circuit 30 is comprised of a transconductance amplifier section 31 and one-shot section 32. Circuit section 31 is included within transconductance amplifier 13 of FIG. 1 and section 32 is included within one-shot 14 of FIG. 1. A voltage feedback signal VFB is coupled as an input to the gate of $M_1$ transistor 34. The source of transistor 34 is coupled to ground, while the drain of transistor 34 is coupled to node 35. The source of transistor 36 is coupled to node 35 and the drain of transistor 36 is coupled to the drain and gate of transistor 37. The source of transistor 37 is coupled to Vcc.

The gate of transistor 38 is also coupled to node 35 and the gate of transistor 39 is coupled to a reference voltage, $\alpha V_{ref}$. The drains of transistors 38 and 39 are coupled to ground. The source of transistor 38 is coupled to the negative input of operational amplifier 40 and to a current source 42. The source of transistor 39 is coupled to the positive input of amplifier 40 and to a current source 41. In the preferred embodiment current sources 41 and 42 are implemented by each using a transistor operating in a saturation region to provide an approximately steady current. The output of amplifier 40 is coupled to the gate of transistor 36.

Circuit section 32 is comprised of input components, transistor 50 and capacitor 51, and the multivibrator stage of transistors 52–59. Amplifier section 31 is coupled to section 32 by having the gate and drain of transistor 37 coupled to the gate of transistor 50. The drain of transistor 50 is coupled to the gate of transistor 52 and one side of capacitor 51. The source of transistor 50 is coupled to Vcc, while the other side of capacitor 51 is coupled to ground. Capacitor 51 functions as the input capacitor described in the description of FIG. 5. The drain of transistor 52 is coupled to the drain of transistor 57 and the gate of transistor 58. A trigger signal which is obtained from the trigger shown in FIG. 1 is coupled as input to the gate of transistor 59. The drain of transistor 59 is coupled to the gate of transistor 57 and the drain of transistor 58. Transistors 55 and 56 are coupled in series between the drain of transistor 58 and Vcc. Transistors 53 and 54 are coupled in series between the drain of transistor 52 and Vcc. Transistors 53–56 operate as current sources. Sources of transistors 52, 57, 58 and 59 are coupled to ground. The output $\theta_O$ is taken as the output of the drain of transistor 52. As used in the preferred embodiment, transistors 37–39, 50 and 53–56 are p-channel devices while the other transistors are n-channel devices. Transistor 62 and inverter 63 couple trigger signal to the gate of transistor 52 for presetting the one-shot. It is appreciated that although a specific circuit implementation is described, other embodiments are available to practice the invention without departing from the spirit and scope of the present invention.

In operation, VFB is coupled to the gate of transistor 34 such that the value of the error feedback voltage VFB controls the gate drive of transistor 34. Transistor 34, in this instance, has a designation $M_1$ and the current through the transistor is designated $I_{REF}$. Node 35 is designed to maintain a voltage potential of $\alpha V_{REF}$, wherein $\alpha V_{REF}$ is the reference voltage which is impressed on the gate of transistor 39. $\alpha V_{REF}$ of transistor 39 is a reference potential which is derived from an internal voltage reference source (not shown). The potential at node 35, being coupled to the gate of transistor 38, provides the gate drive for that transistor, and the reference voltage $\alpha V_{REF}$ provides the gate drive for transistor 39. Amplifier 40 operates as a voltage follower to compare the conduction of transistors 38 and 39, which is determined by the gate drive signals $\alpha V_{REF}$ and node 35. The output of amplifier 40 is coupled to the gate of transistor 36 to control the drive of transistor 36. The above-described circuit components operate to maintain a voltage potential at node 35 which is equivalent to the reference voltage $\alpha V_{REF}$. In the preferred embodiment, $\alpha$ has a value such that $M_1$ remains in its linear range of operation to allow for $\alpha$VFB to operate in wide range.

When the phase lock loop is in a locked condition, the VFB signal designates a no-error condition, such that when $\alpha V_{REF}$ and node 35 are equal and the pulse width of the one-shot and the reference clock are of the same duration. If the pulse width of the one-shot is different than the reference, then an error voltage deviation from the locked condition having a magnitude proportional to the amount of the pulse width difference is present at the gate of transistor 34. The error voltage deviation causes an increase or decrease of the gate drive of transistor 34 such that the resistance of transistor 34 will change and cause current $I_{REF}$ to vary also. The current $I_{REF}$ through transistor 34 varies according to the error voltage because amplifier 40 compares signals $\alpha V_{REF}$ and node 35 voltage and provides a drive to transistor 36 to maintain node 35 at a constant voltage of $\alpha V_{REF}$.

Current $I_{REF}$ is equivalent to the current through transistor 37, and current IOS through transistor 50 is proportionately equal to current $I_{REF}$ because transistors 50 and 37 operate as a current mirror. The operation of current mirrors are well-known in the prior art. Therefore, when the phase lock loop deviates from the locked condition, VFB coupled to the gate of transistor 34 is converted to a feedback current IOS, the value of IOS being proportional to the value of VFB.

The duration of the pulse width of the one-shot section 32 is controlled by the one-shot current IOS. Current IOS through transistor 50 charges capacitor 51, such that when capacitor 51 charges to a predetermined voltage value $V_1$, as shown in FIG. 5, it triggers transistor 52 to terminate the output pulse of the one-shot. The trigger signal at the gate of transistor 59 triggers the commencement of the pulse of the one-shot and the current IOS charging capacitor 51 determines the duration of the pulse width once the one-shot is triggered. The basic operation of a monostable multivibrator as comprised by transistors 52–59 is well-known in the prior art.

FIG. 5 shows the duration of the pulse width $\theta_O$ as time period $\tau$. Period $\tau$ is equivalent to the charging time of capacitor 51. Assuming that at time $t_0$ multivibrator circuit 32 is triggered by a trigger signal at the gate of transistor 59. Current IOS charges capacitor 51 at a predetermined rate until a voltage value $V_1$ is reached. In summary, the error voltage causes current IOS to vary according to the changes of VFB. VFB changes cause the conduction, and hence the resistance $R_{M1}$, of $M_1$ to change, while amplifier 40 maintains node 35 at a voltage potential of $\alpha V_{REF}$. $I_{REF}$ variations are coupled to the one-shot circuit as proportionate IOS changes, wherein the value of IOS determines the time period $\tau$ and ultimately the pulse width of $\theta_O$. In simpler terms, because IOS is a function of the resistance, $R_{M1}$, of transistor 34, $\tau$ is a function of a RC time constant of $R_{M1}$ and $C_{51}$ ($C_{51}$ being the value of capacitance of capacitor 51).

In mathematical terms the relationship between the RC product $R_{M1}C_{os}$ and the one-shot period $T_{os}$ can be derived as follows.

The one-shot current is given by:

$$\frac{G_1 \propto V_{REF2}}{R_{M1}} \quad \text{(Equation 1)}$$

where $G_1 = I_{os}/I_{REF}$
$C_{os}$ = capacitance of the one-shot, C51
$R_{M1}$ = resistance of M1.
The one-shot threshold is give by:

$$V_1 = \frac{1}{C_{os}} \int_0^{T_{os}} I_{os}\, dt = \frac{I_{os} T_{os}}{C_{os}} \quad \text{(Equation 2)}$$

$T_{os}$ = One-shot pulse period.
Substituting $I_{os}$ into the above equation and solving for $R_{M1}C_{os}$.

$$R_{M1}C_{os} = \frac{G_1 \propto T_{os} V_{REF2}}{V_1} \quad \text{(Equation 3)}$$

By design it is possible to make $V_{REF2} = V_1$, which produces, $$R_{M1}C_{os} = G_1 \propto T_{os} \quad \text{(Equation 4)}$$

Therefore since G1 and $\alpha$ are established by transistor and resistor ratios respectively, they can be controlled by design. Moreover when the secondary loop is locked $T_{os}$=PW1 where PW1 is derived from an external reference clock. The result of this is that the time constant Rm1Cos is proportional to the reference frequency, which is the basis for PW1. Thus the time constant is immune to power supply, temperature and process variations. Furthermore since the secondary loop time constant depends only on PW1 the secondary loop is programmable by the digital logic that creates PW1.

It should be appreciated that if the secondary loop bias signals are properly exploited that the primary loop can be made immune to power supply, temperature and process variations. This is achieved by using signals such as IOS1 and VFB1 to bias the primary loop. Furthermore the primary loop filter time constant is made proportional to $R_{M1}C_{os}$ by ratioing the components. The result is a second order PLL which has dynamic characteristics programmable by a digital reference signal.

$$H_{(S)} = \frac{\theta_{O(S)}}{\theta_{I(S)}} \quad \text{(Equation 5)}$$

$$H_{(S)} = \frac{K_D F_{(S)} K_T K_O}{1 + K_D F_{(S)} K_T K_O} \quad \text{(Equation 6)}$$

wherein when put in terms of FIG. 4:
The phase comparator transfer function $K_D$ is given by:

$$K_D = \frac{I_D}{2\pi} \quad \text{(Equation 7)}$$

where $I_D$ is the phase comparator output current.
The loop filter transfer function is given by:

$$F_{(S)} = \frac{1}{SC_r} \quad \text{(Equation 8)}$$

The transconducting amplifier transfer function is given by:

$$K_T = G_1 \propto V_{REF} \beta_{M1} \quad \text{(Equation 9)}$$

where $G_1$ is a current gain factor between $I_{REF}$ and $I_{OS}$ and $\beta_{M1}$ is the Beta of transistor M1,
One-shot transfer function is:

$$K_O = \frac{2\pi}{\tau} \times \frac{C_{os} V_1}{I_{OS}^2} \quad \text{(Equation 10)}$$

where $C_{os}$ is the capacitance of capacitor 51, and by design VREF=$V_1$, is the threshold turn-on voltage of circuit 32.

Constant RC Product Stabilization of Phase Locked Loop

A dynamic of PLL systems must be well controlled to satisfy various system specifications. Primary parameters of concern are the damping factor and the settling time. The dynamic loop characteristics of integrated PLLs normally require off-chip adjustment to control the loop parameters. This is typically achieved by adjusting the loop filter or changing the loop gain. These adjustments are normally made with respect to an external standard reference.

Referring to FIGS. 6 and 7, FIG. 6 shows a block diagram of a two-loop PLL architecture 70 of the preferred embodiment which is implemented on a single semiconductor chip. The PLL which comprises part of the lower portion of the figure forms a primary loop 71 and the PLL which comprises the upper portion of the drawing forms a secondary loop 72. Secondary loop 72 is substantially equivalent to the one-shot PLL circuit of FIG. 1 and corresponding reference numerals of FIG. 1 are utilized, but with a letter "a" attached to the numerals. An object of the secondary loop 72 is to provide internal compensation such that off-chip adjustment is not necessary. If the relationship between the two loops 71 and 72 is correctly exploited, the primary loop 71 will be positioned very close to the center of its designed operating range when the secondary loop 72 is in a locked condition. In addition the gain of all elements in the primary loop is established, including the time constant of the loop filter.

The primary loop 71 is a PLL circuit receiving analog trimming information from secondary loop 72. FIG. 7 shows a block diagram equivalent circuit of primary loop 71. The primary loop 71 is comprised of phase comparator 11b, filter 12b, transconductance amplifier 13b, VCO 73 and digital divider 75. Phase comparator 11b also provides a charge pump function and is typically referred to as such. Blocks 11b, 12b and 13b function basically with the similar intent as the phase comparator 11, filter 12 and transconductance amplifier 13 of FIG. 1, and the same reference numerals are utilized for these respective elements in the primary loop 71, but with the addition of letter "b". However, in the primary loop 71, phase comparator 11b, functions also as charge pump and filter 12b includes both a pole and a zero, the zero being required for compensation. In the primary loop 71, a voltage controlled oscillator (VCO) 73 is used instead of a one-shot. Like the one-shot the threshold of the VCO is established by V1. Digital divider 75 is used to reduce the frequency of the output of the VCO 73, and in the preferred embodiment the output of the digital divider is selected as ½ or ¼ of the frequency of the output of the VCO 73.

As used in the preferred embodiment, lower portion of FIG. 6, which includes primary loop 71, is used to provide a control window in reading data from a memory device, such as a floppy disk. Data pulses from a memory are coupled as input to digital control logic unit 74. The output of the digital divider 75 provides a data window which is used by a memory accessing device to determine when valid data is present for accessing.

Digital control signals from other control sources are coupled to digital control logic 74 and digital divider 75 to provide synchronization and control of these two blocks. Digital control logic 74 receives data pulses from the memory device and generates $\theta_{f2}$ whenever data is present. Control logic 74 also generates a second reference signal $\theta_{REF}$, which provides continuous clock pulses for synchronization when data pulses are not present at the input. Typically, $\theta_{REF}$ is two times the data rate. Although the preferred embodiment is used to generate a valid data window, the dual loop architecture of the present invention can be used in various other applications.

The analog trim information from the secondary loop 72 is used by various blocks of primary loop 71 to control the operation of the primary loop 71. The primary loop 71 will use the current values established by the secondary loop 72 to center the VCO operating frequency and control the gain of the phase comparator 11b and the VCO 73. VFB$_1$ controls the filter 12b. Transconductance amplifier 13a of secondary loop 72 provides VFB and IOS values as analog trim information to blocks 11b, 12b, 13b and 73 of primary loop 71. Transconductance amplifier 13a is designated to have a current mirror gain value of G$_1$. Value G$_2$ is given designating the transconductance gain of the amplifier of block 13b, and G$_3$ is the designation for the scaling factor used in charge pump 11b.

Analog trim information from amplifier 13a is comprised of VFB$_1$ and I$_{OS1}$. VFB$_1$ and I$_{OS1}$ are also used to control the primary loop 71, as well as the secondary loop 72. The primary loop is controlled in such a way that its transfer function is independent of process, temperature and supply voltage. Through the use of this invention the primary loop is controlled by the reference clock only. Furthermore the primary loop is a function of reference frequency in such a way that the frequency response normalized in terms of the reference frequency is independent of reference frequency. This allows the primary loop to be adjusted for different input data rates by simply adjusting the reference clock frequency.

The following analysis will proceed block by block through the primary loop 71. The intention is to demonstrate that it is possible to control the open loop gain and the pole and zero locations of the filter. Moreover given that it is possible to control the open loop gain and filter characteristics, it follows that the closed loop transfer function will also be controlled.

Charge pump 11b accepts I$_{os}$1 and generates a current equal to G$_D$I$_{OS1}$.

The charge pump transfer function is:

$$K_{D2} = \frac{YG_3 \, I_{OS1}}{2\pi} \quad \text{(Equation 11)}$$

Y=Constant which depends on the phase comparator design, data format and the input data pattern.

$$I_{OS1} = \frac{\alpha \, V_{REF}}{R_{M1}} \quad \text{(Equation 12)}$$

Substituting I$_{OS1}$ into the K$_{D2}$ equation and grouping the constants in G$_D$ results in the following:

$$K_{D2} = \frac{G_3 \, V_{REF}}{R_{M1}} \quad \text{(Equation 13)}$$

The loop filter 12b shown in FIG. 14 is comprised of a capacitor C$_1$ and a transistor M1f in series. VFB$_1$ is coupled to the gate of transistor M1f and VFB$_2$ is at the second terminal of the capacitor C$_1$ which is not coupled to transistor M1f. M1f is matched to M1 in 13a of the secondary loop, with the same gate to source voltage VFB such that the drain to source resistance is equal in both transistors. The filter transfer function is given by:

$$F_2 = \frac{R_{M1}C_1 \left( S + \frac{1}{R_{M1}C_1} \right)}{C_1 S} \quad \text{(Equation 14)}$$

C$_1$ is ratioed with respect to COS (C51 of 32).

The transconductance amplifier 13b shown in FIG. 15 accepts VFB$_2$ from filter 12b and is biased by VFB$_1$ to generate I$_{OS2}$. The circuit of FIG. 15 is equivalent to components 34–38, 40, 42 and 50 of FIG. 4 and are referenced accordingly by a prefix "2". Transistor M1t is matched and biased similarly to M1 of circuit 21. Thus the drain to source resistance of M1t is equal to M1. The transfer function is given by:

$$K_{T2} = \frac{G_2}{R_{M1}} \quad \text{(Equation 15)}$$

where G$_2$ is the current mirror gain.

The VCO is designed similarly to the one-shot with the same threshold voltage V1 (which is designed to be equal to VREF) which is established by the one-shot loop. The VCO output signal period is determined by the length of time it takes IVco to charge the COS to VREF. The VCO transfer function is given below:

$$K_{O2} = \frac{\pi}{\text{Cos } V_{REF}} \quad \text{(Equation 16)}$$

The primary PLL's loop gain GH is given by:

$$G_H = \frac{K_{D2}F_2K_{T2}K_{O2}}{2NS} \quad \text{(Equation 17)}$$

where N is a digital divider term.

Plugging in the equations for $K_{D2}$, $F_2$, $K_{T2}$, and $K_{O2}$ and grouping the constants into a single constant $G_T$ produces:

$$G_H = \frac{G_T(R_{M1}C_1S + 1)}{S^2R_{M1}CosR_{M1}C_1} \quad \text{(Equation 18)}$$

This equation states that the open loop transfer function has two poles at the origin and a zero located at $1/R_{M1}$Cos. It was shown previously that the secondary PLL forces the $R_{M1}$Cos time constant to be independent of process, temperature and supply voltage, and directly proportional to the reference clock period. This implies that the open loop transfer function is process, temperature and supply voltage independent.

Thus it follows that the closed loop transfer function given below is also independent.

$$\frac{\theta_F}{\theta_{I2}} = \frac{G_H}{1 + G_H} \quad \text{(Equation 19)}$$

Also it can be shown that the zero is proportional to the reference clock frequency. Furthermore the loop gain is proportional to the square of the reference clock frequency. As stated earlier this indicates the closed loop frequency response plotted vs the normalized frequency is independent of the reference frequency. As a result it is possible to tune the primary loop for different data rates by changing the reference clock frequency.

Phase Comparator for Extending Capture Range

Referring to FIG. 8, a schematic diagram of a PLL phase comparator circuit, which can be used in the phase comparator block 11b of FIG. 6 is shown. UP and DOWN signals activate current sources which either source or sink currents to the filter 12b which then causes a respective change in the feedback voltage VFB2. Circuit 100 is a prior art circuit comprised of D type flip-flops 101, 102, 103 and NAND gate 104. Input data such as $\theta_I$ is coupled as input to clock flip-flops 101 and 102. Loop feedback signal, designated as $\theta_f$ in FIG. 6 is coupled as a clock input to flip-flop 103. The D input of flip-flop 101 is grounded while the D input of flip-flops 102 and 103 are coupled to Vcc. The inverted output of flip-flop 101 is coupled to reset input of flip-flops 102 and 103, which is an active low input. Output of flip-flop 102 is used to generate an UP control signal while the output of flip-flop 103 is used to generate a DOWN control signal. UP and DOWN control signals are coupled as inputs to NAND gate 104 wherein the output of NAND gate 104 is used to reset flip-flop 101.

Functionally, when the PLL circuit is in a locked condition, $\theta_I$ and $\theta_f$ will have their phases synchronized such that flip-flops 102 and 103 will gate NAND gate 104 to generate a reset signal from flip-flop 101 to reset flip-flops 102 and 103. However, whenever the two input signals $\theta_I$ and $\theta_f$ are not in phase, the UP and DOWN signal will be activated depending on the direction of the phase error, and the duration of the generated signal determines the amount of the error.

Also referring to FIG. 9, a waveform representation of the phase error is better illustrated showing phase error as a function of a voltage change. At zero phase error, the PLL loop is operating in a locked condition and no phase difference is present between the two input signals. This no error condition is shown by point 110. Whenever the PLL circuit slips out of the phase locked condition it moves away from point 110 along the slope of the curve 111. The distance from point 110 determines the amount of phase error. Whenever the accumulation of the phase error takes the circuit along slope 111 to a slip point 112, the PLL circuit can completely shift one whole phase as shown by arrows 113 and 114. Typically when this occurs, the PLL circuit will lock onto the previous or the succeeding phase and the circuit will be out of phase by $\pi/2$ and driving towards $\pi$ further away from the original lock point resulting in increased time for capture. This slip is a typical condition in the prior art. In order to prevent such a slip from occurring, the preferred embodiment utilizes an extended range logic circuit to inhibit such phase slips.

Referring to FIG. 10, an extended range logic circuit 120 is utilized in conjunction with the phase comparator circuit of FIG. 8. Same two input signals $\theta_I$ and $\theta_f$ are coupled to the extended range logic circuit 120. The UP and DOWN output signals of the circuit of FIG. 8, now labeled as PU and PD, respectively, are coupled as inputs to multiplexer (MUX) 121 along with two control outputs EPU and EPD from extended range logic circuit 120. MUX 121 selects either the PU/PD or the EPU/EPD as output APU/APD, which provide the phase error signal to the next stage.

Also referring to FIG. 11, a graphic illustration showing the operation of circuit 109 of FIG. 10 is shown. Zero phase error condition occurs at point 110a as was the case in FIG. 9. As phase error accumulates, the PLL circuit moves along slope 111a, the direction being dependent on the lead or lag error. When the accumulated phase error is along slope 111a, extended range logic circuit 120 is not utilized and circuit 109 operates as a circuit by passing PU and PD signals through MUX 121, such that APU and APD are equivalent to PU and PD, respectively. However, when the phase error accumulation reaches point 117 or 118, circuit 120 is utilized and MUX 121 selects EPU and EPD as output APU and APD.

An object of circuit 120 is to force a correction of the phase error at a much greater magnitude than that provided by PU and PD. That is, in the base circuit of FIG. 8, the rate of correction of a phase error at all given points along slope 111a remains approximately proportional to the error. As shown in FIG. 9, if the phase error extends past the threshold level 112 before any correcting factor can be applied, the circuit will slip one complete phase. However, with circuit 120 of the present invention, as the phase error accumulates along slope 111a, it will reach a predetermined point 117 or 118 which causes circuit 120 to be activated. When circuit 120 is activated, EPU and EPD correction factor, which is significantly greater than the PU and PD correction factor applied during the course of travel along slope 111a, will force the phase locked loop to return to position 110a at a much faster rate. This faster error correction provided by circuit 120 is shown in FIG. 12. When the phase error reaches the point 117/118, EPU/EPD is generated by circuit 120 and passed through MUX 121 as APU/APD, respectively. This results in an increase in the rate of change of the loop filter voltage to increase the charge rate of the loop filter capacitor resulting in a faster response time of the loop. Zone 122 illustrates the area of operation when circuit 120 is activated, and zone 122 also exemplifies the increase in the correction voltage. Thus, as phase error approaches a value where a complete phase shift can occur, circuit 120 is activated to force the error to be compensated at a much greater magnitude. The faster response rate is not used below the limit points 117 and 118 because such a fast response rate near point 110a is undesirable for loop stability.

The preferred embodiment provides for the fast response by increasing the rate of change of the loop filter voltage such that the rate of voltage change on the loop filter is four times the change for normal operation. This is due to the fact that the signals EPU and EPD are active four times longer, and as a result of the increased rate of change on the filter voltage, the loop frequency change per data period is increased. Because there is a relationship between phase and frequency, the loop has the ability to change phase at a greater rate when the extended capture range is used.

Referring to FIG. 12, it shows the extended range logic circuit 120 as utilized in the preferred embodiment in reference to the primary loop block diagram of FIG. 6 of the present invention. Also referring to FIG. 13, it shows the various waveform diagrams of the signals referenced in FIG. 12. The circuit 120 is comprised of slip detection circuitry and slip compensation circuitry. D type flip-flops 130, 131 and NAND gate 132 comprise the slip detection circuitry. A $\overline{\text{SLIPCHK}}$ signal is coupled as an input to flip-flop 130 wherein the output is coupled to the input of D flip-flop 131 and to one input of NAND gate 132. The other input of NAND gate 132 is coupled to the output of D flip-flop 131. A $\theta_F$ signal is coupled to clock flip-flops 130 and 131. A reset signal is also coupled to flip-flops 130 and 131 to reset these flip flops. The output of NAND gate 132 is referenced as the SLIP signal.

In operation, data pulse inputs to digital control logic 74 generates data pulses 140. A $\overline{\text{SLIPCHK}}$ pulse, having a predetermined duration, is generated whenever data pulse 140 is encountered. The $\overline{\text{SLIPCHK}}$ signal is coupled as an input to flip-flop 130 wherein the $\theta_F$ signal clocks flip-flop 130. The timing is established such that the output on NAND gate 132 is in a low state, showing a non-slip condition, whenever the loop is operating in a locked state or having a limited phase difference equivalent to slope 111a of FIG. 11. However, when the phase differential enters region 122 as shown in FIG. 11, it is equivalent to the data pulses 140 occurring at a considerable time difference from the feedback signal $\theta_F$. In this instance, $\overline{\text{SLIPCHK}}$ signal will have shifted such that when $\theta_F$ clocks flip-flops 130 and 131, the output of NAND gate 132 is driven high showing a slip condition, which is equivalent to the circuit extending beyond limit points 117 and 118 in FIG. 11. The output of NAND gate 132 is coupled as one input to NAND gate 135 and 136, as well as to one input of NOR gate 137. The SLIP signal will activate either NAND gate 135 or 136 depending on the direction of the slip.

The slip compensating circuitry compares $\theta_R$ and $\theta_F$ to determine the direction of the slip and generates appropriate correction signals for generation of EPU and EPD signals. $\theta_R$ is coupled to clock flip-flop 133, and $\theta$hd F is coupled to clock flip-flop 134. The inverted outputs of each of these flip-flops are coupled to the D input of the other respective flip-flop. The non-inverted output of flip-flop 133 is coupled to the input of flip-flop 141. Flip-flop 141 has a level trigger, although such a requirement is not essential to the function of a latch represented by flip-flop 141. $\overline{\text{SLIPCHK}}$ signal is coupled through inverter 138 to reset the inputs of flip-flops 133 and 134 as well as to second input of NOR gate 137, and $\overline{\text{ENABLE}}$ signal is also coupled as a third input to NOR gate 137. The output of NOR gate 137 is coupled to flip-flop 141 directly, as well as through inverter 139 for activating flip-flop 141 to update the data.

In operation, when the loop is in a locked condition, the leading edges of $\theta_R$ and $\theta_F$ occur approximately at the same time as shown by the lines 142 and 143 linking the leading edges of $\theta_R$ and $\theta_F$ in FIG. 13.

When the loop is operating in the unlocked condition, input $\theta_R$ will occur either earlier or later by a duration 144 or 145, respectively as shown in FIG. 13. Flip-flops 133 and 134 will determine the direction of the phase difference between $\theta_R$ and $\theta_F$, and circuit 141 will store the direction of the phase difference, that is if it is leading or lagging. Flip-flops 130, 131 monitor the phase error in the loop and assert slip through 132 when the phase error exceeds the slip threshold. Gates 137–139 restrict 141 updates to non-slip periods.

Whenever the limit of the slip condition is reached, which is equivalent to area 122 of FIG. 11, SLIP signal will activate NAND gates 135 and 136 to permit magnitude data from flip-flop 141 to pass as output EPU or EPD. Basically, devices 133–134, 137–139 function to decode the direction of the slip and is used when a certain limit level is reached.

In the preferred embodiment, NAND gates 148 and 149 are utilized to comprise MUX 121 of FIG. 10. $\overline{\text{EPU}}$ and $\overline{\text{PU}}$ are coupled as inputs to NAND gate 148, and $\overline{\text{EPD}}$ and $\overline{\text{PD}}$ are coupled as inputs to NAND gate 149. When the slip condition is not encountered, NAND gates 135 and 136 are deactivated permitting signals $\overline{\text{PU}}$ or $\overline{\text{PD}}$ to pass through NAND gates 148 and 149 to generate APU and APD signals, respectively. However, when the slip condition occurs, NAND gates 135 and 136 are activated and one of two signals, $\overline{\text{EPU}}$ or $\overline{\text{EPD}}$ is passed through to NAND gates 148 and 149, respectively. In this instance, because of the duration of the $\overline{\text{EPU}}$ and $\overline{\text{EPD}}$ signals being of significantly longer duration than $\overline{\text{PU}}$ and $\overline{\text{PD}}$ signals, the $\overline{\text{EPU}}$ or the $\overline{\text{EPD}}$ signal will override the PU and PD signals such that the output of NAND gate 148 and 149 will be governed by one of $\overline{\text{EPU}}$ or $\overline{\text{EPD}}$ signals.

Thus, a dual loop phase locked loop system has been described which also uses a dual settling time response to phase slippage. Further, the PLL of the present invention is implemented on a single semiconductor integrated circuit chip.

We claim:

1. In a phase comparator having a first input signal, a second input signal, a first correction output signal that indicates error correction in a first direction, and a second correction output signal that indicates error correction in a second direction that is opposite to the first direction, an extended range logic circuit comprising:

means for generating a slip signal that indicates that a phase difference between the first input signal of the comparator and the second input signal of the comparator has reached a predetermined value;

means for generating a direction signal that indicates the direction of the phase difference between the first input signal of the comparator and the second input signal of the comparator;

means responsive to the direction signal, the slip signal, and an enable signal for generating an acceleration signal that indicates error correction in a first direction and for generating a brake signal that indicates error correction in a second direction that is opposite from the first direction, wherein the acceleration and brake signals are updated only during non-slip periods;

means responsive to the slip signal, the acceleration signal, and the brake signal for generating a third correction output signal that indicates error correction in a first direction and for generating a fourth correction output signal that indicates error correction in a second direction that is opposite from the first direction; and means responsive to the first, second, third, and fourth correction output signals for selecting one among the first, second, third, and fourth correction outputs signals, wherein the first and second correction output signals provide error correction at a first rate and the third and fourth correction output signals provide error correction at a second rate that is faster than the first rate, whereby a more rapid error correction is achieved when the phase difference between the first input signal of the comparator and the second input signal of the comparator reaches the predetermined value.

2. In a phase comparator having a first input signal, a second input signal, a first correction output signal that indicates error correction in a first direction, and a second correction output signal that indicates error correction in a second direction that is opposite to the first direction, an extended range logic circuit comprising:

a first flip-flop having an input that is a pulse of a predetermined duration generated whenever a data pulse is encountered, the first flip-flop being clocked by the first input signal of the comparator;

a second flip-flop having an input coupled to an output of the first flip-flop, the second flip-flop being clocked by the first input signal of the comparator;

a logic gate having a first input coupled to the output of the first flip-flop, a second input coupled to an output of the second flip-flop, and an output that is a slip signal that indicates that a phase difference between the first input signal of the comparator and the second input signal of the comparator has reached a predetermined value;

a third flip-flop which is clocked by the second input signal of the comparator;

a fourth flip-flop which is clocked by the first input signal of the comparator and which has an input that is coupled to a first output of the third flip-flop and an output that is coupled to an input of the third flip-flop, wherein a second output of the third flip-flop is a direction signal that indicates the direction of the phase difference between the first input signal of the comparator and the second input signal of the comparator;

a fifth flip-flop having an input coupled to the second output of the third flip-flop and having a first output that is an acceleration signal that indicates error correction in a first direction and a second output that is a brake signal that indicates error correction in a second direction that is opposite from the first direction; and a logic circuit having the slip signal, the acceleration signal, and the brake signal as inputs, having a first output that is a third correction signal that indicates error correction in a first direction, and, additionally, having a second output that is a fourth correction signal that indicates error correction in a second direction that is opposite from the first direction, whereby a more rapid error correction is achieved when the phase difference between the first input signal of the comparator and the second input signal of the comparator reaches the predetermined value.

3. The extended range logic circuit of the phase comparator of claim 2, further comprising:

means responsive to the slip signal, the pulse applied as an input to the first flip-flop, and an enable signal for generating an update signal that allows the acceleration and brake signals of the fifth flip-flop to be updated only during non-slip periods.

4. The extended range logic circuit of the phase comparator of claim 2, wherein the first input signal of the comparator is a feedback signal and the second input signal of the comparator is a clock signal.

* * * * *

UNITED STATES PATENT AND TRADEMARK OFFICE
CERTIFICATE OF CORRECTION

PATENT NO. : 4,819,081
DATED : 4/4/89
INVENTOR(S) : Volk et al.

It is certified that error in the above-identified patent and that said Letters Patent is hereby corrected as shown below:

| | | |
|---|---|---|
| col. 03, line 59 | delete "1/SCr" | insert --$1/SC_F$-- |
| col. 08, line 32 | delete "$I^2_{os}$" | insert --$I_{os}^2$-- |
| col. 08, line 41 | after "dynamic" | insert --behavior-- |
| col. 13, line 04 | delete "12" | insert --11-- |
| col. 14, line 07 | delete "θ hd F" | insert --$θ_F$-- |
| col. 14, line 56 | delete "PU, PD" | insert --$\overline{PU}$ and $\overline{PD}$-- |

Signed and Sealed this

Nineteenth Day of March, 1991

*Attest:*

HARRY F. MANBECK, JR.

*Attesting Officer*     *Commissioner of Patents and Trademarks*